United States Patent [19]

Johnson et al.

[11] 4,143,234

[45] Mar. 6, 1979

[54] SOLAR COLLECTOR USING TOTAL INTERNAL REFLECTANCE

[75] Inventors: Gregory R. Johnson, University City; Malcolm G. Miles, Olivette, both of Mo.; Ival O. Salyer; Edgar E. Hardy, both of Dayton, Ohio

[73] Assignee: Monsanto Company, St. Louis, Mo.

[21] Appl. No.: 739,769

[22] Filed: Nov. 8, 1976

[51] Int. Cl.$^2$ .................................... H01L 31/06
[52] U.S. Cl. ....................... 136/89 PC; 136/89 SJ
[58] Field of Search ............... 136/89 SJ, 89 PC; 350/288, 293, 160 R; 126/270, 271

[56] References Cited

U.S. PATENT DOCUMENTS

| 3,134,906 | 5/1964 | Henker | 250/211 |
|---|---|---|---|
| 3,873,829 | 3/1975 | Evrard et al. | 250/213 R |
| 3,973,994 | 8/1976 | Redfield | 136/89 |
| 3,976,508 | 8/1976 | Mlavsky | 136/89 |
| 4,029,519 | 6/1977 | Schertz et al. | 136/89 PC |
| 4,045,246 | 8/1977 | Mlavsky et al. | 136/89 PC |

OTHER PUBLICATIONS

N. B. Goodman et al, "Solid-Dielectric compound Parabolic Concentrators: On Their Use With Photovoltaic Devices", Applied Optics, vol. 15, pp. 2434–2436, (1976).

H. J. Hovel, "Semiconductors & Semimetals –vol. 11, Solar Cells", Academic Press, (1975), p. 203.

*Primary Examiner*—John H. Mack
*Assistant Examiner*—Aaron Weisstuch
*Attorney, Agent, or Firm*—Henry Croskell; Lawrence L. Limpus

[57] ABSTRACT

A solar collector is constructed of a photoelectric cell mounted within a collector of the total internal reflectance type. The photoelectric cell has the form of a rod of a monocrystalline element or compound with a generally cylindrical junction spaced at a distance radially inwardly from the outer surface of the rod. The photoelectric cell is mounted within a trough shaped collector which is at least partially filled with a transparent solid wherein total internal reflectance of incident radiation increases the effectiveness of the collector.

4 Claims, 6 Drawing Figures

SOLAR COLLECTOR USING TOTAL INTERNAL REFLECTANCE

BACKGROUND OF THE INVENTION

This invention relates to photoelectric cells and collectors for transforming radiation energy into electrical energy. More particularly, it relates to the use of semiconducting monocrystalline elements with solid filled collectors of the total internal reflectance type for collection and utilization of radiant energy from solar and other sources.

Photoelectric cells are used for transforming radiation energy into electrical energy. The incident photons are absorbed in the semiconductor where they produce minority charge carriers, either holes or electrons, which diffuse to a charge separating junction, typically near the illuminated surface of the photoelectric cell, and make possible a delivery of electricity by the cell.

Generally, photoelectric cells consist of semiconductor wafers of various shapes. These semiconductor wafers are reduced to a desired final thickness by sawing, etching, and lapping with an accompanying loss of typically about one-half of the semiconductor material. However, the thickness of conventional semiconductor wafers cannot be reduced without limit because the photoelectric cell response will be reduced and, because the semiconductor materials are very brittle, the wafers break easily during manufacture and use unless proper thermal and physical conditions are maintained.

The phototelectric cell can be used with a collector to increase the amount of solar radiation reaching the surface of the cell, thereby increasing its effectiveness and electrical output. Many types and shapes of collectors, such as flat and curved mirrors, dished reflectors, fresnel lenses, and various trough shaped reflectors, have been used to concentrate sunlight upon a photoelectric cell. However, the problems inherent in efficient utilization of solar energy and the required intricate and costly apparatus for tracking the sun in its apparent daily motion through the heavens have not been adequately resolved by these devices.

SUMMARY OF THE INVENTION

It is an object of the invention to provide a photoelectric cell having a more favorable shape for receiving illumination and for installation into operational solar collection systems. A further object of this invention is to provide a collector of the total internal reflectance type to concentrate incident solar radiation upon the surface of the photoelectric cell.

Briefly, there is provided a photoelectric cell in the form of a rod of a semiconducting monocrystalline element or compound. The rod has a body of cylindrical form of first electrical conductivity type and a surface layer of second electrical conductivity type surrounding at least a portion of the body to form a junction of generally cylindrical form between the body and the surface layer. A first electrode is secured to the body and a second electrode is secured to the surface layer, the electrodes being insulated from one another.

Both conventional photoelectric cells and the rod shaped photoelectric cell of this invention can use a collector to increase the amount of sunlight reaching the surface of the cell, thereby increasing the effectiveness of the cell and its electrical output. Configurations of collectors which are particularly well suited for use with this invention are those in the shape of a trough, for example a trough in the form of a nonimaging curved collector or of a straight-sided vee-shaped collector. By employing a solid dielectric of suitable shape rather than a metalized reflector, total internal reflectance can be used to increase the concentration of solar energy reaching the photoelectric cell or to increase the angle of acceptance of the incident energy into the collector.

Open trough or dish collectors have two general weaknesses: their angular acceptance angle, for acceptance of incident radiation, is limited and a substantial light loss, typically 20%, is caused by imperfect metal reflections within the trough. The use of total internal reflection, through the filling of the collector with a solid material having a suitable index of refraction, helps to solve the aforementioned problems with the added advantage of ease in large scale fabrications using plastics or glasses. The incident light is reflected at the entrance end of the total-internal-reflectance-type collector, thereby substantially increasing the acceptance angle of the system. After refraction, the light impinges on the side surfaces which are surrounded by low refractive index media, air for example, and suffers total internal refraction thereby eliminating the light losses encountered on metallic reflection.

DESCRIPTION OF THE PREFERRED EMBODIMENT

Figure 1:
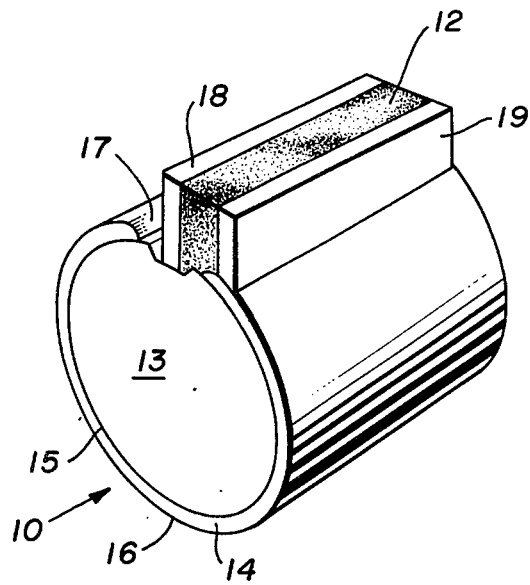
FIG. 1 is a drawing showing the rod shaped photoelectric cell.

Attention is now directed to the annexed drawings wherein like numbers denote like or corresponding parts throughout the several views; in which:

The photoelectric cell, generally numbered 10, of this invention is shown in FIG. 1 in its normal configuration as a generally cylindrical rod of a monocrystalline semiconductor material generally having a diameter of between 1 and 10 millimeters. A body 13 has a generally cylindrical form comprised of a material having a first electrical conductivity type. A surface layer 14 of a material having a second electrical conductivity type surrounds the body 13 such that a junction 15, having a generally cylindrical shape, is formed between the body 13 and the surface layer 14 and a surface 16 is formed on the exterior perimeter of the photoelectric cell 10. An example of a photoelectric cell 10 having this configuration is comprised of a rod with a body 13 of p-type silicon and a surface layer 14 of n-type silicon such that a p-n junction 15 of generally cylindrical form is produced. The junction 15 is typically located between 0.1 and 0.4 microns beneath the surface 16. Electrical energy is produced by the photoelectric cell 10 when the photons of incident radiation are absorbed in the semiconductor material and produce minority carriers, holes or electrons, which diffuse to the charge separating junction.

For use of the photoelectric cell 10 electrical contact is required with both the body 13 and the surface layer 14. When the surface layer 14 completely surrounds the body 13, as shown in FIG. 1, a groove 17 is formed along a portion of the length of the photoelectric cell 10 to provide a location for electrical contact with the body 13. The groove 17 is between 0.4 and 3.0 millimeters in width at the surface 16 of the photoelectric cell 10 and at least 0.4 microns in depth to penetrate the junction 15. The shape of the groove 17 may vary, but the groove will typically be in the shape of a rectangle, a 'U', or a 'vee'. A first electrode 18, a metallic strip, is secured within the groove 17 to provide electrical and thermal contact with the body 13. The second electrode 19, a metallic strip similar to the first electrode 18, is secured to the surface 16 of the photoelectric cell 10, adjacent to and parallel the first electrode 18 but separated therefrom by an insulating layer 12, to provide electrical contact with the surface layer 14.

Figure 2:
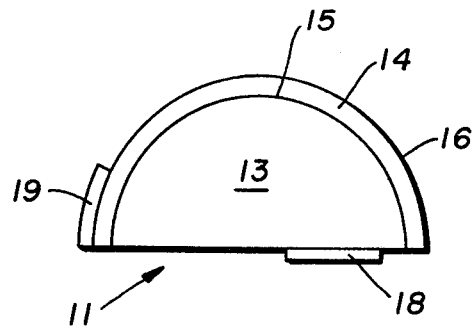
FIG. 2 is a drawing showing a typical arcuate section of the photoelectric cell.

FIG. 2 shows a modification of the photoelectric cell 10 wherein an arcuate section 11 of the cell is used. On the arcuate section 11 the surface layer 14 and junction 15 surround only the portion of the body 13 that will be exposed to incident radiation. As with the cylindrical photoelectric cell 10, a first electrode 18 is attached to the body 13 and a second electrode 19 is attached to the surface layer 14 in such a manner that incident radiation continues to strike a major portion of the surface layer 14.

The effectiveness of the photoelectric cell is enhanced by the use of a collector or concentrator to increase the flux of solar energy onto the surface of the cell. Typical collectors having trough-shaped configurations are shown in FIGS. 3 and 4.

Figure 3:
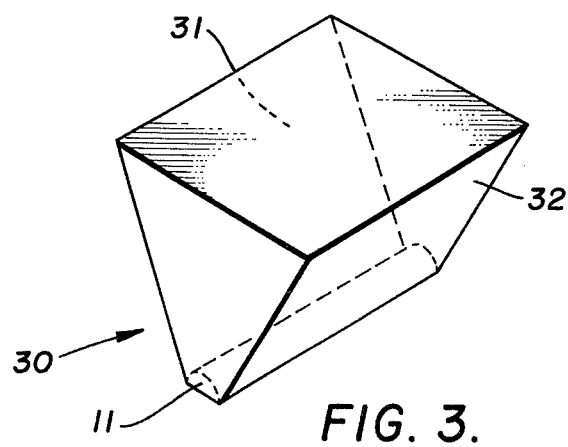

A straight-sided collector 30 is shown in FIG. 3. The collector 30 is a trough having the form of a truncated wedge with straight sides 31 and 32. An arcuate section photoelectric cell 11, for example one-half of the rod as shown in FIG. 2, is secured at the narrower end of the wedge while the wider end forms the entrance to the collector 30.

Figure 4:
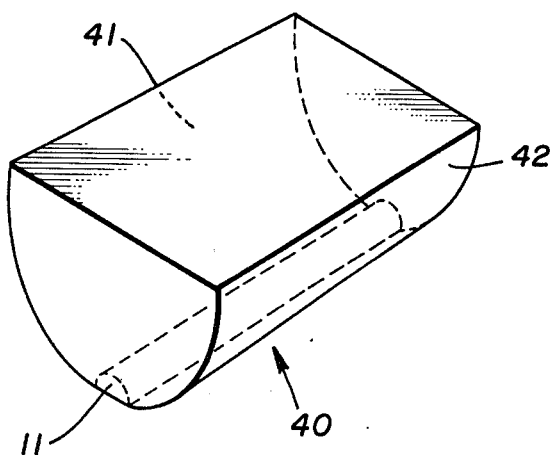
FIGS. 3 and 4 show the photoelectric cell with typical forms of solid collectors.

FIG. 4 shows collector 40 having the form of a trough with inwardly curved sides 41 and 42. An arcuate section photoelectric cell 11 is secured to and extends along the bottom of the collector 40. The collector 40, wider at the top than at the bottom, accepts radiant energy from an area typically greater than three times the surface area of the arcuate section 11 and concentrates it upon the surface of the arcuate section 11.

The acceptance angle of all of these collectors is increased by filling the forms with a transparent dielectric material such as glass or plastic with refractive index $N_2$ greater than that of air, $N_1 = 1$. Further gains in collector efficiency are obtained, subject to the limitations noted below, when the metal shell is removed entirely. Metallic reflection, typically 80% complete, is thus replaced by total internal reflection at the dielectric to air interface which is nearly 100% complete.

The special characteristics of the reflection of light at an air/dielectric interface must be taken into account to realize the advantages of total internal reflection for sunlight concentrators. Light propagating within an optically dense medium of refractive index $N_2$ is totally reflected at an interface with air of refractive index $N_1$ only when the sine of the angle of incidence as normally defined is greater than the ratio $N_1/N_2$. Thus there are two necessary conditions for total internal reflection of a specific light ray: the ray must be directed from the dense dielectric toward the air, and not vice versa; and the ray must be sufficiently oblique to the surface to satisfy the mathematical relationship above.

For a solid, dielectric trough shape to perform effectively as a sunlight concentrator for photoelectric cells, it is necessary that light be injected into the dielectric at the front surface, reflected at suitably shaped sidewalls, and ejected from the transparent dielectric into the cell. Injection of light rays into solid dielectrics of index $N_2$ occurs with high efficiency for angles of incidence less than $\tan^{-1} N_2$. Thus it is advantageous that the front surface of the collector be approximately normal to the direction of the sun. For a typical dielectric, $N_2 = 1.5$, high reflectivity at the front surface does not become a problem until the angle of incidence exceeds 56°. These losses can be reduced by application of an anti-reflective coating to the front surface.

The general performance characteristics of both metallic and total internal reflecting sunlight concentrators are determined by the shape and texture of the sidewalls. In the case of total internal reflectance, however, rays which are insufficiently oblique to the walls are only partially reflected and energy is lost from the concentrator by the portion of the rays passing through. This can be avoided by designing the wall shape so that this situation seldom arises or by metallizing certain zones of the wall where partial internal reflection is likely to occur.

The use of solid dielectric sunlight concentrators poses special problems in transferring the radiant energy flux from the dielectric to the photoelectric cell. Should air, or any medium having an index of refraction less than that of the collector dielectric, partially or wholly fill the spacing between the refractive collector dielectric and the photoelectric cell, then, instead of refracting and transmitting the light to the surface of the photoelectric cell, the surface of the collector dielectric which is adjacent the photoelectric cell may become an additional reflecting surface similar to the sides of the collector and a substantial portion of the light which enters the collector may be reflected away from the photoelectric cell rather than transmitted to it greatly reducing the efficiency of the collector.

Figure 5:
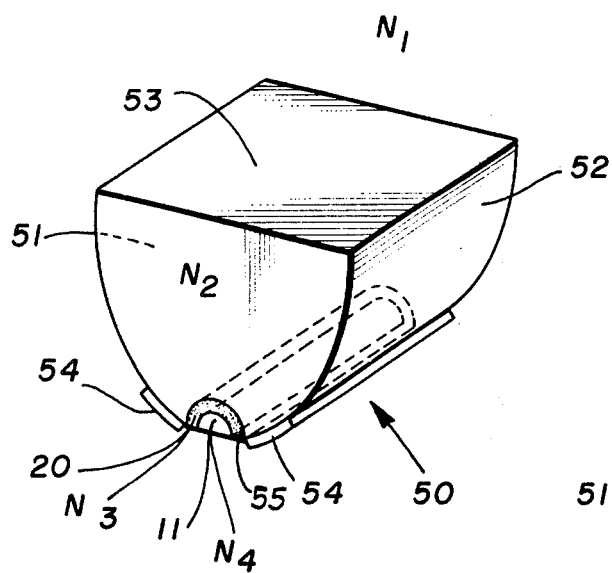
FIG. 5 shows an end view of an arcuate section of the photoelectric cell in combination with a solid collector.
Figure 6:
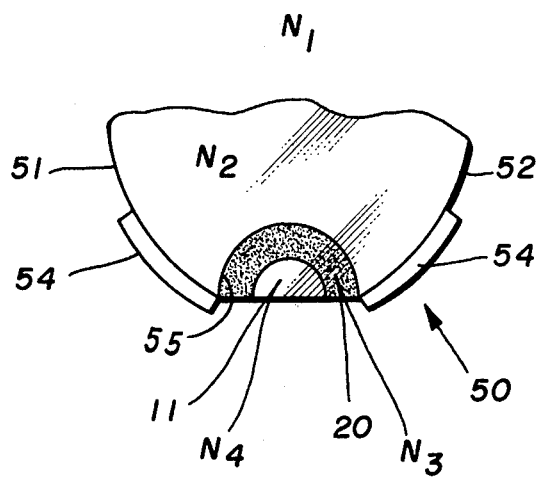
FIG. 6 is an enlargement of a portion of FIG. 5 to show the photoelectric cell in optical contact with the collector.

When the collector is formed from a solid block, as shown in FIGS. 5 and 6, an additional layer of a refractive material must fill the space between the photoelectric cell and the solid collector. In FIG. 5 a solid collector 50 in the form of a trough having inwardly curving sidewalls 51 and 52 is shown. An arcuate section photoelectric cell 11 is shown attached to the bottom of the collector. The bottom of the collector 50 is formed along its length with a grooved recess 55 in the shape of an arcuate section of a cylinder whose diameter is at least as great as the diameter of the photoelectric cell 11. Cell 11 is accomodated within recess 55 and is secured to collector 50 by means of refractive index bridge material, to be elaborated upon below. FIG. 6 is an enlargement of a portion of the solid collector shown in FIG. 5 to show the contact between the solid collector 50 and the arcuate section photoelectric cell 11 through the use of a refractive index bridge 20 between the collector 50 and photoelectric cell 11. At the base of the collector 50, on each side of the photoelectric cell 11, a zone of metalization 54, to reflect light rays which are insufficiently oblique to the walls 51 and 52 for total internal reflection, is shown.

The solid collector 50 is formed from a glass or plastic material having an index of refraction $N_2$ greater than the index of refraction for air, $N_1 = 1$. Thus:

$$N_2 > N_1 = 1$$

The solid collector 50 is in optical contact with air, index of refraction $N_1 = 1$, at its entrance, thus solar radiation striking the surface is accepted by the collector 50. Accepted light strikes the sidewalls 51 and 52 at an angle greater than the critical angle and is internally reflected toward the photoelectric cell 11. For certain zones of the collector which are subject to partial rather than total reflection, an application of a metal reflecting layer may be useful. Efficient transmission of energy between the solid collector 50 and the photoelectric cell 11 is required. To ensure an efficient transmission path from the material of the solid collector 50 to the surface of the photoelectric cell 11 a refractive index bridge 20, such as an organic grease or adhesive having an index of refraction $N_3$, is used between the collector 50, with index of refraction $N_2$, and the photoelectric cell 11, which has an index of refraction $N_4$. The solar collector will operate when $N_3$ has any value between $N_1$ and $N_4$:

$$N_1 < N_3 < N_4$$

However, the light transmittal from the collector 50 to the photoelectric cell 11 is poor when the value of $N_3$ is between that of $N_1$ and $N_2$:

$$N_1 < N_3 < N_2$$

It is therefore preferred that the interface material 20 be chosen to have an index of refraction at least equal that of the collector material but less than that of the material of the photoelectric cell:

$$N_2 < N_3 < N_4$$

It may be quickly seen that the refraction of solar radiation at the entrance to the collector by the material within the total internal reflectance type collector increases the angle of acceptance of the collector when compared to an identical collector without any filling material, thus sunlight is accepted for a longer period of time and in greater quantities without adjusting the position of the collector. Likewise, if an acceptance angle is specified, the total-internal reflectance type collector may be made smaller than the conventional unfilled collector.

For additional concentration of the solar radiation two collectors may be attached such that the second collector is connected to the bottom of the first collector.

It is difficult to mount conventional wafer photoelectric cells in operational solar collection systems. Their large diameter and minimum thickness make them fragile, easily broken by handling and mounting forces. The rod shaped photoelectric cell of this invention in contrast has a very rigid form which is easily handled. In addition, because of its shape, the photoelectric cell of this invention may be more advantageously packed in a solar collector array than a conventional wafer can.

As various changes could be made in the construction herein described without departing from the scope of the invention, it is intended that all matter contained in the above description shall be interpreted as illustrative and not in a limiting sense.

We claim:

1. A solar cell device comprising a photoelectric cell having the form of rod of a semiconducting monocrystalline element or compound of elements, said rod having a body in the form of at least an arcuate section of a cylinder, a p-n junction adapted to receive solar radiation spaced at a distance radially inwardly from the outer surface of said body and extending within at least a portion of said body parallel to the outer surface and forming a surface layer on said arcuate surface of said body, a first electrode secured to said body and a second electrode secured to a portion of said surface layer, such that incident solar radiation strikes said surface layer, said first and second electrodes being insulated from one another; in combination with a non-imaging collector, said collector having the form of a trough, having sides generally curved in shape, said photoelectric cell being secured to and extending along the bottom of said collector, said bottom of said collector having a grooved recess formed therein along its length, said grooved recess being in the form of an arcuate section of a cylinder whose diameter is at least as great as the diameter of said rod shaped photoelectric cell, whereby said photoelectric cell is accomodated in and secured to said recess, said collector being wider at the top than at the bottom wherein radiant energy, accepted by said collector over an area larger than the surface area of said photoelectric cell, will be concentrated upon said cell, said collector comprising a transparent body of material having an index of refraction intermediate that of the surface of said photoelectric cell and air such that incident solar radiation is retained within said collector and concentrated upon said rod by total internal reflectance; said collector having means for specular reflection, constituted by a mirrored surface placed on certain areas of the surface of said collector where otherwise partial internal reflectance would occur.

2. The solar cell device of claim 1 wherein a refractive index bridge is disposed between said collector and said photoelectric cell, said bridge comprising a transparent material having a refractive index determined by:

$$N_2 < N_3 < N_4$$

wherein $N_2$ is the index of refraction of the material of said collector, $N_3$ is the index of refraction of said refractive index bridge, and $N_4$ is the index of refraction of said photoelectric cell, such that solar radiation entering said collector is efficiently transmitted to said photoelectric cell by total internal reflectance.

3. The solar cell device according to claim 2 wherein an anti-reflective coating is applied to the radiant energy incident surface of the collector.

4. The solar cell device of claim 1 wherein an anti-reflective coating is applied to the radiant energy incident surface of said collector.

* * * * *